United States Patent [19]

Nakamura et al.

[11] Patent Number: 5,650,741
[45] Date of Patent: Jul. 22, 1997

[54] POWER LINE CONNECTION CIRCUIT AND POWER LINE SWITCH IC FOR THE SAME

[75] Inventors: Toru Nakamura, Kagoshima; Katsuya Ishikawa, Kawasaki, both of Japan

[73] Assignees: Fujitsu Limited, Kanagawa; Kyushu Fumitsu Electronics Limited, Kagoshima, both of Japan

[21] Appl. No.: 622,933

[22] Filed: Mar. 27, 1996

Related U.S. Application Data

[63] Continuation of Ser. No. 249,022, May 25, 1994, abandoned.

[30] Foreign Application Priority Data

May 27, 1993 [JP] Japan ................................. 5-126271

[51] Int. Cl.$^6$ .................................................. H03K 5/08
[52] U.S. Cl. ........................... 327/327; 327/313; 327/314; 327/328; 327/379
[58] Field of Search .................................... 327/309, 314, 327/315, 324, 325, 327, 328, 379, 384, 389, 427, 530, 543, 545, 546, 432, 433, 434, 544, 313

[56] References Cited

U.S. PATENT DOCUMENTS

| | | | |
|---|---|---|---|
| Re. 32,526 | 10/1987 | Hochstein | 327/432 |
| 3,902,078 | 8/1975 | Peterson | 327/374 |
| 4,316,243 | 2/1982 | Archer | 327/427 |
| 4,420,700 | 12/1983 | Fay et al. | 327/434 |
| 4,877,982 | 10/1989 | Walker | 327/432 |
| 4,890,020 | 12/1989 | Bird | 327/434 |
| 4,992,683 | 2/1991 | Robin, Jr. | 327/432 |
| 5,005,061 | 4/1991 | Robb et al. | 327/430 |
| 5,023,474 | 6/1991 | Wilcox | 327/390 |
| 5,028,811 | 7/1991 | Le Roux et al. | 327/427 |
| 5,047,675 | 9/1991 | Cerato et al. | 327/434 |
| 5,111,084 | 5/1992 | Suko | 327/374 |
| 5,115,143 | 5/1992 | Rohulich et al. | 327/427 |
| 5,241,502 | 8/1993 | Lee et al. | 327/390 |
| 5,258,662 | 11/1993 | Skovmand | 327/427 |
| 5,298,817 | 3/1994 | Banak et al. | 327/434 |
| 5,321,313 | 6/1994 | Oberhauser | 327/432 |
| 5,362,998 | 11/1994 | Iwamura et al. | 327/433 |
| 5,365,118 | 11/1994 | Wilcox | 327/427 |
| 5,371,418 | 12/1994 | Leipold et al. | 327/427 |
| 5,510,747 | 4/1996 | Williams | 327/434 |

FOREIGN PATENT DOCUMENTS

| | | | |
|---|---|---|---|
| 294 881 | 12/1988 | European Pat. Off. | |
| 59-12622 | 1/1984 | Japan | 327/432 |
| 61-59911 | 3/1986 | Japan | |
| 3-158018 | 7/1991 | Japan | 327/432 |
| 6-152360 | 5/1994 | Japan | 327/309 |

OTHER PUBLICATIONS

Low-Cost Circuits Maintain Quality of Multiplexed Video Signals by Greg Schaffer, 2119 E.D.N. Electrical Design News 32 (1987) May 14, No. 10, pp. 193-200.

*Primary Examiner*—Terry Cunningham
*Attorney, Agent, or Firm*—Armstrong, Westerman, Hattori, McLeland & Naughton

[57] ABSTRACT

An object of the present invention is to provide a power line connection circuit which obtains a desired turn-on resistance and a turn-off resistance without using a complex external circuit. The power line connection circuit provides a MOS transistor arranged in a power supply line, whose continuity is changed by applying a control signal from a control unit; a voltage conversion means for converting the voltage of the control signal; and a clamp means for clamping the converted voltage output from the voltage conversion means so as to have a predetermined voltage difference with respect to the voltage of said power supply line.

6 Claims, 11 Drawing Sheets

PRIOR ART

Fig.5A $$Ron = \frac{V_B - V_A}{Is}$$

POWER LINE CONNECTION CIRCUIT AND POWER LINE SWITCH IC FOR THE SAME

This application is a continuation of application Ser. No. 08/249,022 filed May 25, 1994, now abandoned.

BACKGROUND OF THE INVENTION

1. Field of the invention

The present invention relates to a power line connection circuit for controlling the connection of an electrical device to a power supply line and a switching IC for a power supply line. More specifically, the invention relates to a power line connection circuit which has a small turn-on resistance and has a discharge circuit in order to stabilize a voltage of the power supply line, the discharge circuit quickly discharging the electric charge in a capacitive element when the power supply line is disconnected and does not permit a current to flow into the discharge circuit when the power supply line is connected.

2. Description of the Related Art

In electrical devices, it is important to reduce power consumption. Particularly, when a battery is used as a power supply, power consumption is very important because power consumption influences the life of the battery. Namely, power consumption determines the time for which the battery can be used without being exchanged or charged. There has been proposed a power conservation method in which a device is divided into a plurality of portions, and the supply of power to non-operating portions is shut-off. Many kinds of electrical devices include functional portions which must always operate even if the devices are not being used. For example, in an electrical device having a timer function, the timer function must operate even when the device is not being used. However, if power is supplied to the whole device in order to operate the timer function even when the device is not used, large amounts power are consumed because standby currents flow in the portions which are not needed. Therefore, when the above power conservation method is applied to this device, the device is divided into a main portion and a sub-portion having a timer function. Power is not supplied to the main portion when the device is not used but power is supplied to the sub-portion even when the device is not used.

Further, in a computer system, a plurality of peripheral devices such as a display, a disk unit, a printer, etc. are connected to a computer. These peripheral devices may not always operate even when the computer operates. Therefore, power consumption of the computer system can be reduced by stopping the supply of power to peripheral devices which are not needed.

In order to perform the above method, it is necessary to freely stop the supply of power to each portion. A power line switch IC is used to control connection between the power supply line and each portion. The switch IC is controlled by a control signal output from a control portion included in the sub-portion which always operates.

In general, a power FET has been used as the power line switch, and the power line connection circuit has heretofore been realized as a discrete circuit using the power FETs.

In the power line connection circuit, it is important that the resistance of the switch is so small that it can be neglected when it is turned on and that the switch is completely cut off when it is turned off. When the switch has a resistance when it is turned on, the voltage drops correspondingly and electric power is wasted. When the switch is not completely cut off when it is turned off, a current flows in trace amounts into the device unit when the switch is turned off and the electric power is consumed. In the conventional power line connection circuit using the MOS transistor, therefore, the MOS transistor must operates such that the turn-on resistance is very small, and the turn-off resistance is very large.

For instance, assuming that the voltage of the power supply line is 5V, an N-channel MOS transistor has a very large resistance when 0V is applied to its gate, and it has a very small turn-on resistance when a voltage higher than 5V is applied to its gate. (In the following, the turn-on resistance is called ON resistance, and the turn-off resistance is called OFF resistance.) Therefore, in the conventional power line connection circuit using an N-channel MOS transistor, a voltage higher than a positive logical value of the control unit is generated, and this voltage is applied to the gate of N-channel MOS transistor. In the case of the P-channel MOS transistor, a voltage higher than a positive logical value is applied to the gate of P-channel MOS transistor for obtaining a very large OFF resistance.

Therefore, in the conventional device including the power line connection circuit, a voltage conversion circuit is provided in order to generate the voltage higher than a positive logical value of the control unit.

Further, in some kinds of electric devices, supply voltages to portions are changed between different voltages according to operation modes. For example, in an electrically erasable nonvolatile semiconductor memory which is called a flash-memory, only 5V is supplied for reading operation, and 12V is supplied for writing and erasing operations. When N-channel FETs having same characteristics are used as switches for the 5V and 12V power supply lines, the ON resistances of these switches are different because an ON resistance of an N-channel FET changes according to the voltage between the gate and the drain of the FET.

Electric devices generally have specifications in which acceptable ranges of ON resistances of power supply lines are determined. When N-channel FETs having the same characteristics are used in power line connection circuits of different voltages, a problem may result in that a few connection circuits cannot satisfy the above ON resistance specifications. In those cases, the specifications have been satisfied by using N-channel FETs having different characteristics, or by changing the output voltages of the voltage conversion circuits. For example, the output voltage can be adjusted by resistances of resistors used in the voltage conversion circuits. However, it is not efficient for production processes to use different N-channel MOS transistors or to adjust elements. These problems cause production cost increases.

When different power supply voltages are respectively supplied to different portions and power line connection circuits of these portions are realized by using similar FETs, the same problem again ocurrs.

As described above, the power line connection circuit has heretofore been realized by a discrete circuit using a power FET, and a voltage conversion circuit which generates a voltage applied to the gate of the power FET. However, this results in high production costs. It has been desired to reduce the size of the circuit and the cost of production by realizing the power line switches in the form of ICs.

Further, because the voltage of a control signal applied to a gate of the power FET is constant, there occurs a problem that ON resistances cannot satisfy the specifications when power FETs having same characteristics are used for different power supply voltages. Particularly, when a plurality of power FETs are integrated in an IC, it is impossible to respectively adjust the ON resistances of the power FETs. Therefore, it is difficult to make the power line connection circuits of different voltages by using an IC which includes several power FETs.

A capacitive element is usually connected to stabilize the voltage of the power supply line. By using such a capacitive element, the power supply voltage is stably maintained against the fluctuation in the electric power consumed by the device unit. However, when the capacitive element is connected, the voltage of the power supply line gradually decreases when the switch for power supply lines is turned off due to the electric charge stored in the capacitive element, therefore, there arises a problem of an increase in the erroneous operation in the device unit. In a conventional device, a discharge circuit in which a resistor element is connected in parallel with a capacitive element is provided in order to prevent the occurrence of erroneous operation.

In the constitution having a discharge resistor, furthermore, there exists a problem in that a current flows at all times from the power supply line to ground via the resistor when the power line switch is turned-on. The resistor generally has a very large resistance, and the consumption of electric power due to the current flowing through the resistor is very small. However, such a consumption of electric power could become a serious problem in the devices which use batteries.

SUMMARY OF THE INVENTION

An object of the present invention is to provide a power line connection circuit which exhibits a desired ON resistance and a desired OFF resistance, and which has a discharge circuit in order to stabilize the voltage of the power supply line, the discharge circuit quickly discharging the electric charge in a capacitive element when the power line switch is turned off and not permitting a current to flow into the discharge circuit when the power line switch is turned on.

A power line connection circuit according to a first aspect of the present invention includes a MOS transistor for controlling the connection of a load circuit to a power supply line. The MOS transistor is arranged in the power supply line connected to the load circuit. The continuity of the MOS transistor can be changed by applying a control signal output from a control unit. The control signal is applied to a gate of the MOS transistor. The power line connection circuit includes a voltage conversion means which converts a voltage of the control signal and a clamp means which clamps the converted voltage output from the voltage conversion means so as to have a predetermined voltage difference from a voltage of the power supply line.

In the power line connection circuit according to a first aspect of the present invention, the clamp means clamps the converted voltage output from the voltage conversion means so as to have a predetermined voltage difference with respect to a voltage of the power supply line. Therefore, even when a voltage of the power supply line changes, the voltage difference between the gate and the drain of the MOS transistor is constant. Because the voltage difference between the gate and the drain determines the ON resistance of the MOS transistor, the MOS transistor has a constant ON resistance when it is turned on.

A power line connection circuit according to a second aspect of the present invention includes a power line switch arranged in a power supply line to a load circuit, and controls the connection of a power supply line to a load circuit by turning the power line switch on or off. The power line connection circuit includes a discharge means which connects a node between the MOS transistor and the load circuit to a ground line when the power line switch is turned off, and cuts off the node from the ground line when the power line switch is turned on.

In the power line connection circuit according to the second aspect of the present invention, when the power line switch is turned off, the electric charge stored in a capacitive element for stabilizing the voltage of the power supply line is quickly discharged through the discharge means. When the power line switch is turned on, the discharge means is cut off, therefore, the undesired current does not flow through the discharge means. Accordingly, the consumption of electric power can be reduced.

Further, when at least one of the voltage conversion means, the clamp means or the discharge means is installed in an IC with the power line switch, the power line connection circuit can be realized with a simpler constitution by using this IC than by using descrete elements.

BRIEF DESCRIPTION OF THE DRAWINGS

The present invention will be more clearly understood from the description as set forth below with reference to the accompanying drawings, wherein:

FIGS. 1A and 1B are diagrams illustrating conventional power line switches using MOS transistors, FIG. 1A shows an example using N-channel MOS transistor, and FIG. 1B shows an example using P-channel MOS transistor;

FIGS. 5A and 5B are diagrams illustrating characteristic of an ON resistance of N-channel MOS transistor, FIG. 5A shows a circuit for measuring this characteristic, and FIG. 5B shows a characteristic;

FIG. 12 is a diagram illustrating a constitution of a sixth embodiment of the present invention;

DESCRIPTION OF THE PREFERRED EMBODIMENTS

Before proceeding to a detailed description of the preferred embodiments of the present invention, prior art power line connection circuits will be described below for a clearer understanding of the differences between the present invention.

Figure 1A:
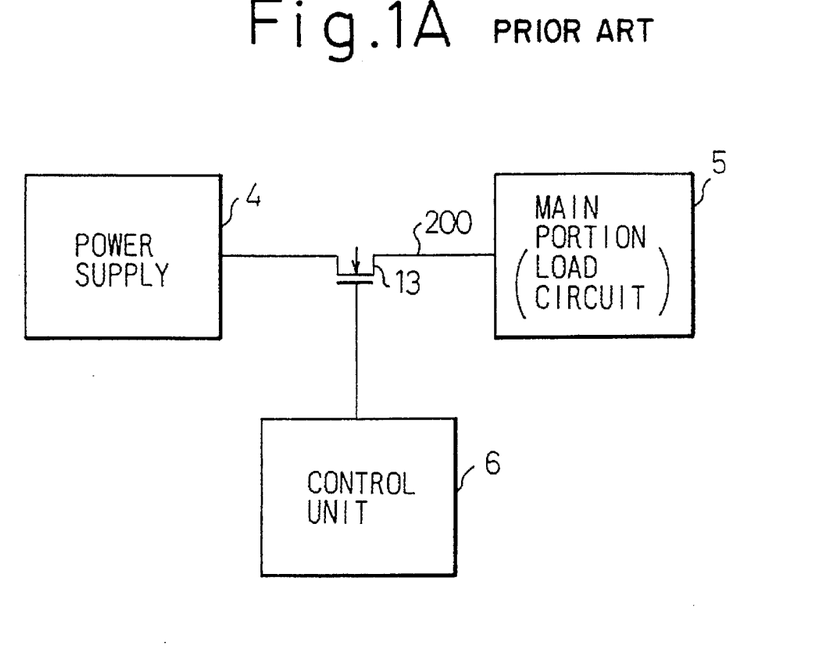
Figure 1B:
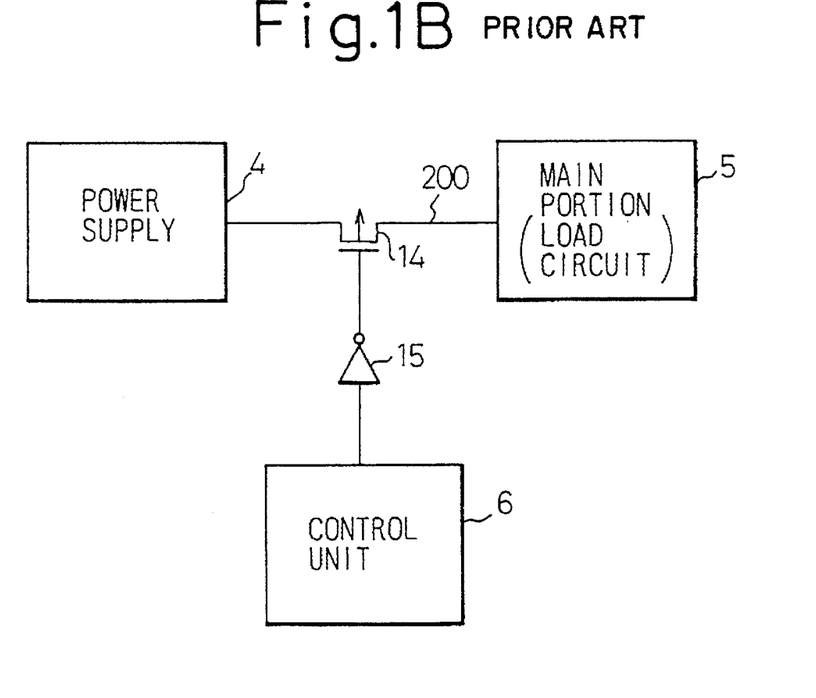

In general, the power line connection circuit has heretofore been realized with a discrete circuit using a power FET. FIGS. 1A and 1B are diagrams illustrating conventional power line connection circuit using a MOS transistor. FIG. 1A illustrates an example of using an N-channel MOS transistor and FIG. 2B illustrates an example of using a P-channel MOS transistor. Throughout the drawings, the same functional parts are denoted by the same reference numerals.

In FIGS. 1A and 1B, reference numeral 4 denotes a power supply; 5 denotes a main portion of a device which operates as a load circuit; 6 denotes a control unit; 200 denotes a power supply line. 13 and 14 denotes power supply line switches, the switch 13 is an N-channel MOS transistor, and the switch 14 is a P-channel MOS transistor. 15 denotes an inverter which inverts a control signal.

In the circuit shown in FIG. 1A, a signal at a positive voltage is fed from the control unit 6 to turn an N-channel MOS transistor 13 on, and a signal at ground voltage is fed from the control unit 6 to turn it off. In the circuit shown in FIG. 1B, a P-channel MOS transistor 14 is used, therefore, an inverter 15 for inverting the control signals must be provided if the control unit 6 outputs the same control signals as those of FIG. 1A.

As described above, in the constitution using a power supply line switch shown in FIGS. 1A and 1B, it is important that the resistance of the switch is so small that it can be neglected when it is turned on and that the switch is completely cut off when it is turned off.

Figure 2:
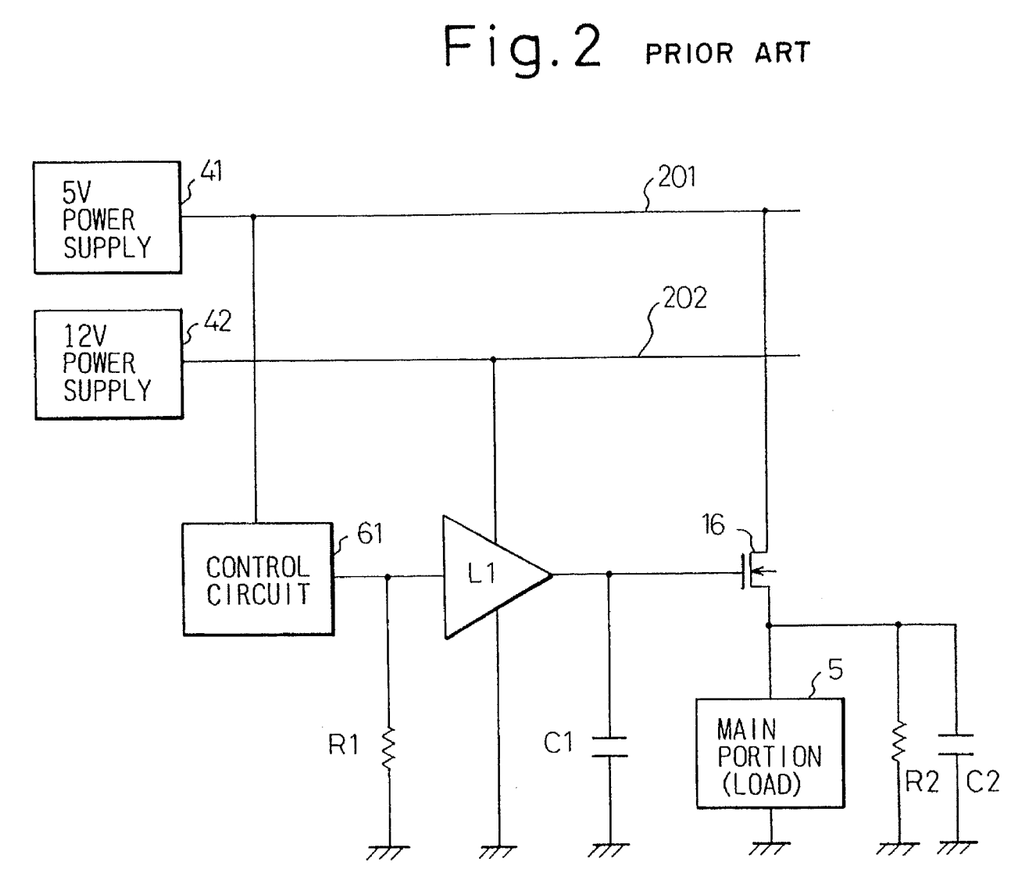
FIG. 2 is a circuit diagram illustrating the constitution of a conventional power line connection circuit.

FIG. 2 is a circuit diagram illustrating an example of a conventional power line connection circuit using a power supply line switch.

In FIG. 2, reference numeral 5 denotes a main portion of a device which operates a load circuit; 16 denotes an N-channel MOS transistor which operates as the power line switch; 21 denotes a power supply of 5V; 22 denotes a power supply of 12V; 61 denotes a control circuit; 201 denotes a power supply line of 5V; 202 denotes a power supply line of 12V. L1 denotes a voltage conversion circuit which converts a control signal of about 5V output from the control circuit 6 into a control signal of 12V. The control signal of 12V output from the voltage conversion circuit L1 is applied to a gate of the N-channel MOS transistor 16. A resistor R1 is a pull-down resistor which increases the operating speed of the control signal output from the control circuit 61. A capacitive element C1 is provided for stabilizing the output of the voltage conversion circuit L1. It is a well-known technique that capacitive elements such as capacitors are provided to stabilize a voltage of the power supply line 200 connected to the load 5. By using the capacitive elements, a stable voltage of the power supply can be obtained even when power consumption in the main portion fluctuates. A resistor R2 and the capacitive element C2 are used for this reason.

As described above, the control signal applied to the gate of the N-channel MOS transistor 16 must satisfy the above-mentioned condition. Therefore, as shown in FIG. 2, the voltage conversion circuit L1 which converts the control signal into a signal having an appropriate voltage must be provided. Further, the power supply 42 of 12V must be provided for the voltage conversion circuit L1.

Figure 3:
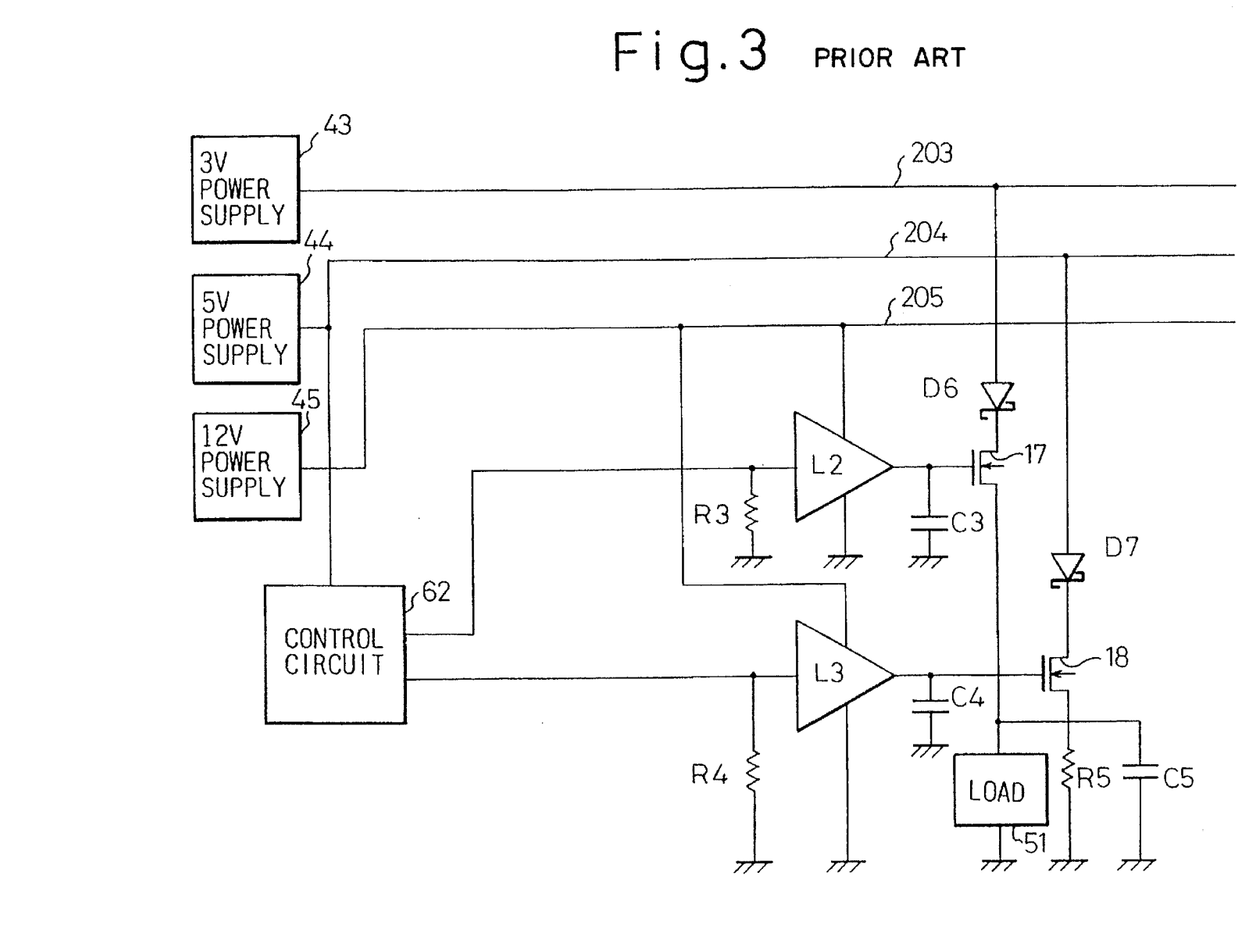
FIG. 3 is a circuit diagram illustrating the constitution of an another conventional power line connection circuit.

FIG. 3 is a circuit diagram illustrating a constitution of a conventional power line connection circuit of a device in which power supply voltages supplied to some portions are switched between different voltages according to operational modes.

In FIG. 3, a power supply 44 of 5V, a power supply 45 of 12V, an N-channel MOS transistor 18, a voltage conversion circuit L3, a load 51, resistors R4 and R5, and capacitive elements C4 and C5 respectively correspond to those of FIG. 2. In addition to these elements, the circuit shown in FIG. 3 further provides a power supply 43 of 3V and a power supply line switch using an N-channel MOS transistor 17 in the power supply line 204 to the load 51. A voltage conversion circuit L2 which converts a voltage of a control signal applied to a gate of the N-channel MOS transistor L2 is also provided. The control circuit 62 outputs control signals which turn either of the N-channel MOS transistors 17 and 18 on, or turn both of them off.

Figure 4:
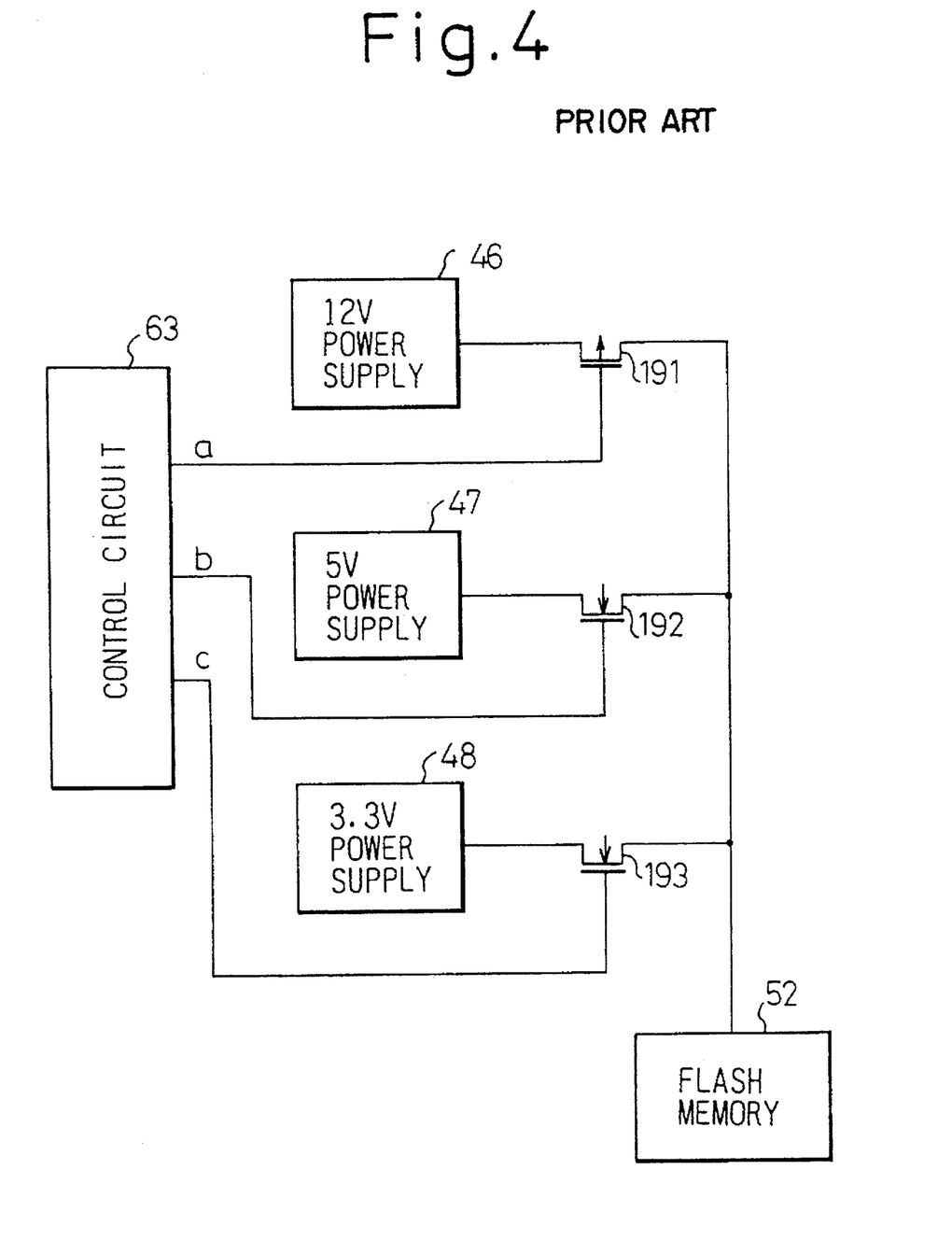
FIG. 4 is a diagram illustrating a conventional power line connection circuit for a flash memory.

FIG. 4 is a diagram illustrating a conventional power line connection circuit of an electrical erasable nonvolatile memory which is called a flash memory. The flash memories are divided into two types. In one type, 5V is supplied on the power supply line when stored data is read. In the other type, 3.3V is supplied on the power supply line when stored data is read. In both types, 12V is supplied on the power supply line when data is written. 5V type is a normal type, and 3.3V type is a power conservation type. In a device using the flash memories, it is desired that either type of flash memories can be used. Therefore, as shown in FIG. 4, a power supply 46 of 12V, a power supply 47 of 5V and a power supply 48 of 3.3V are provided, and a P-channel MOS transistor 191 and N-channel MOS typs transistors 192, 193 are provided on respective power supply lines to the flash memory 52. These transistors are controlled by control signals a, b and c output from the control circuit 63. The control signal a is "low" for write and erase operations, and it is "high (12V)" except the above operations. When the normal type flash memory is used, the control signal b is "high (12V)" when the flash memory 52 is accessed, and it is "low" while a standby mode. Similarly, when the power conservation type flash memory is used, the control signal c is "high (12V)" when the flash memory 52 is accessed, and it is "low" while a standby mode.

Some kinds of micro-processors automatically switch themselves to power conservation modes when the micro-processors do not operate for a predetermined time. In the power conservation modes, power supplies are switched from 5V to 3.3V. In order to realize these circuits, the above power line connection circuits are used.

Figure 5A:
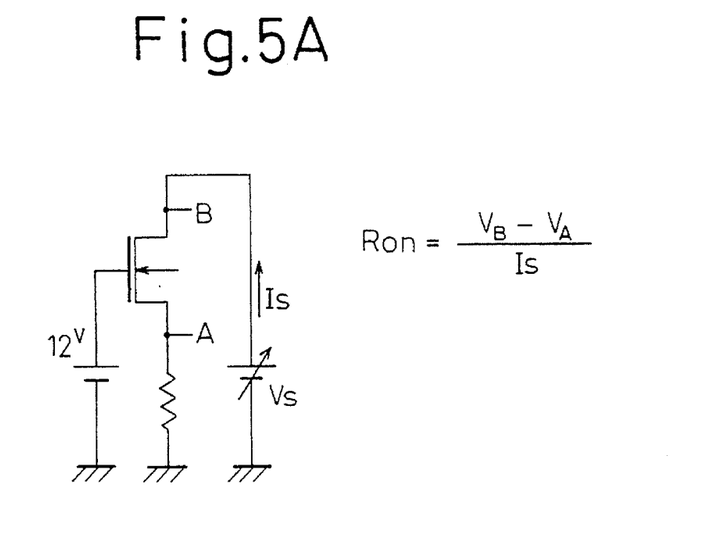
Figure 5B:
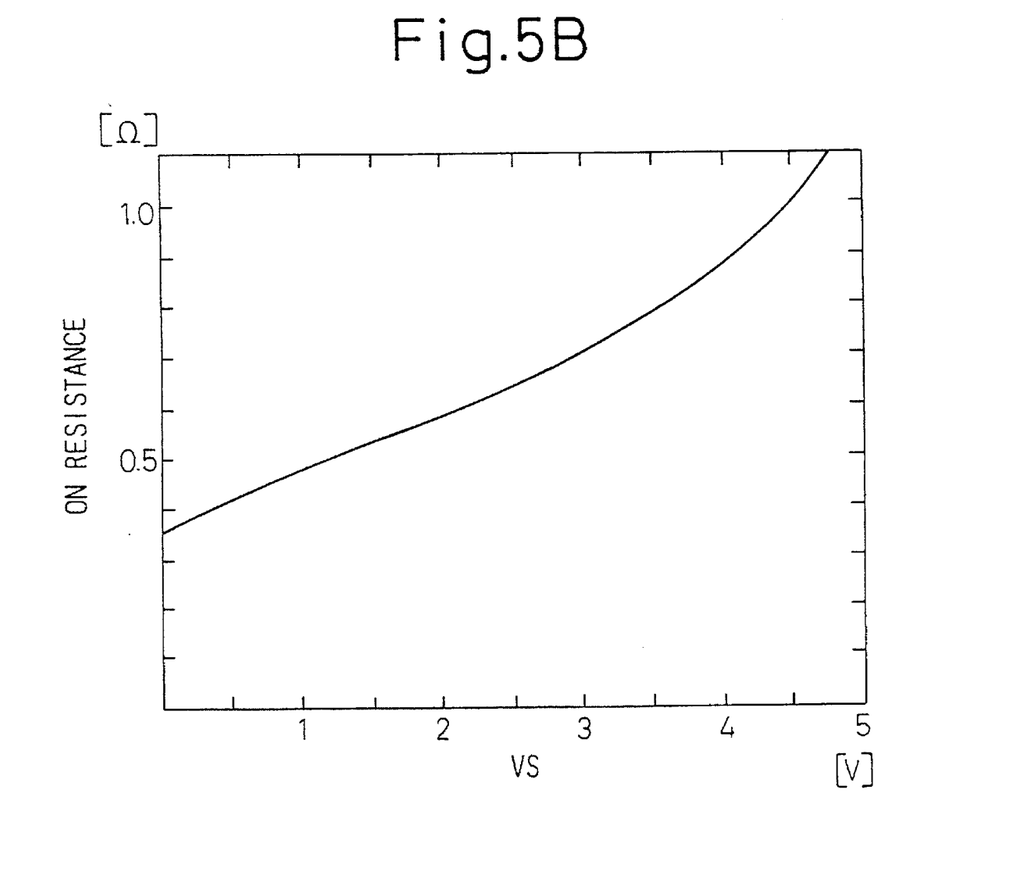

FIGS. 5A and 5B are diagrams illustrating the characteristic ON resistance of N-channel MOS transistor. FIG. 5A shows a circuit for measuring this characteristic, and FIG. 5B shows a characteristic measured by the circuit shown in FIG. 5A. From FIG. 5B, it is apparent that the ON resistance changes according to the power supply voltage Vs even when a constant voltage is applied to a gate of the transistor. Accordingly, when N-channel MOS transistors 17 and 18 shown in FIG. 3 have same characteristics, the ON resistances of those transistors are different. As described above, in the conventional circuits, the same ON resistances are obtained by using transistors having different characteristics or by adjusting output voltages of the voltage conversion circuits.

In the above descriptions, examples in which the power line switches are realized by using N-channel MOS transistors are described. When the switches are realized by using P-channel MOS transistors, low enough ON resistances are obtained by applying 0V to gates. However, when the P-channel MOS transistors of same characteristics are connected to power supply lines having different voltages, the OFF resistances of the transistors are different. When high enough OFF resistances cannot be obtained in the circuits shown in FIGS. 3 and 4 in which one load circuit is connected to a plurality of power supply lines, currents flow between the power supply lines even when the switches turn off. Therefore, there occurs a problem that the power consumption increases.

Figure 6:
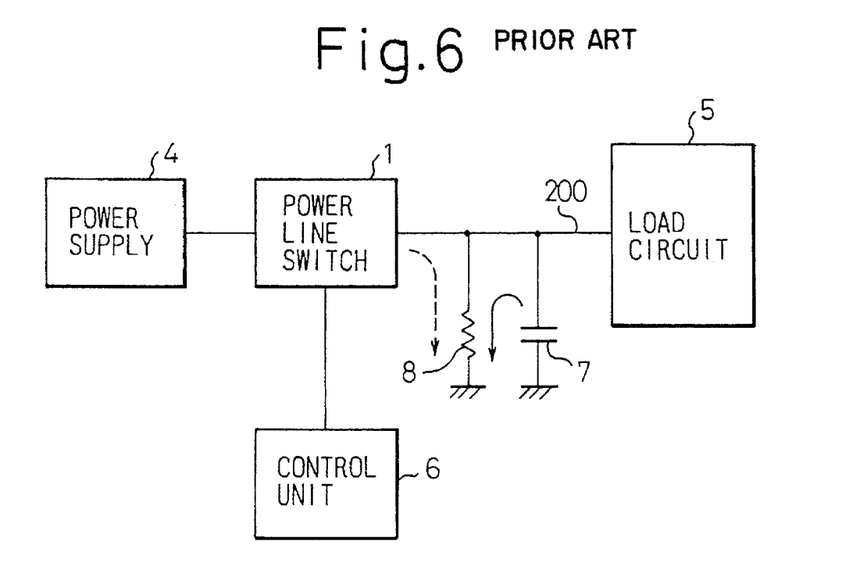
FIG. 6 is a diagram illustrating a constitution of a conventional power line connection circuit having a capacitive element for stabilizing a voltage of the power supply line and a discharge resistor.

As shown in FIGS. 2 and 3, a capacitive element is usually connected to stabilize the voltage of the power supply line 200. By using such a capacitive element, the power supply voltage is stably maintained against the fluctuation in the electric power consumed by the device unit. When the capacitive element is connected, however, the voltage of the power supply line 200 gradually decreases when the switch 1 for the power supply lines is turned off due to the electric charge stored in the capacitive element, causing a problem of an increase in the erroneous operation in the device unit. FIG. 6 is a diagram illustrating a conventional constitution having a discharge circuit in which a resistor element is connected in parallel with a capacitive element in order to prevent the occurrence of erroneous operation.

As shown in the figure, the circuit of FIG. 6 has a constitution in which a capacitor 7 and a discharge resistor 8 are connected to the circuit of FIGS. 1A and 1B in order to stabilize the voltage of the power supply line 200. The electric charge stored in the capacitor 7 flows into a ground line through the resistor 8 as soon as the power line switch 1 is turned off, and the voltage of the power supply line 200 quickly drops.

However, the discharge circuit shown in FIG. 6 has a problem in that a current flows at all times from the power supply line 200 to the ground line via the resistor 8 during the turned-on state. The resistor generally has a very large resistance, and the consumption of electric power due to the current flowing through the resistor is very small. However, such a consumption of electric power could become a serious problem in the devices which use batteries.

The power supply circuits described above have heretofore been constituted by discrete circuits using power FETs. Therefore, these circuits have problems that the production costs are high. It has therefore been desired to reduce the size of the circuit and the cost of production by realizing the power line switches in the form of an IC.

Figure 7:
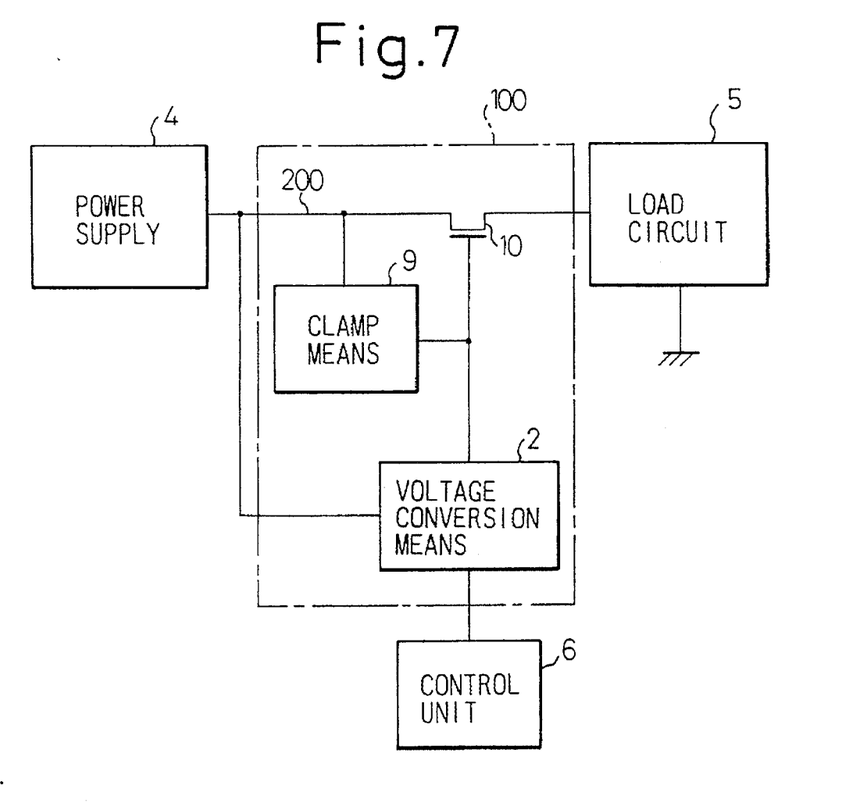
FIG. 7 is a diagram illustrating a fundamental constitution of a first aspect of the present invention.

FIG. 7 is a diagram illustrating a fundamental constitution of a first aspect of the present invention.

In FIG. 7, reference numeral 4 denotes a power supply; 5 denotes a load circuit; 6 denotes a control unit; 10 denotes a MOS transistor; 2 denotes a voltage conversion means; 9 denotes a clamp means; and 200 denotes a power supply line.

In the circuit shown in FIG. 7, the clamp means 9 clamps the converted voltage output from the voltage conversion means 2 so as to have a predetermined voltage difference to a voltage of the power supply line 200. Therefore, even when the voltage of the power supply line 200 changes, the voltage difference between the gate and the drain of the MOS transistor 10 is constant. Therefore, assuming that the MOS transistor 10 is an N-channel type, the MOS transistor has a constant ON resistance when it is turned ON.

When elements of the power line connection circuit are integrated into an IC, it is desired that elements in the area denoted by the reference numeral 100 are integrated. Namely, the MOS transistor 10, the voltage conversion means 2 and the clamp means 9 are preferably integrated.

Figure 8:
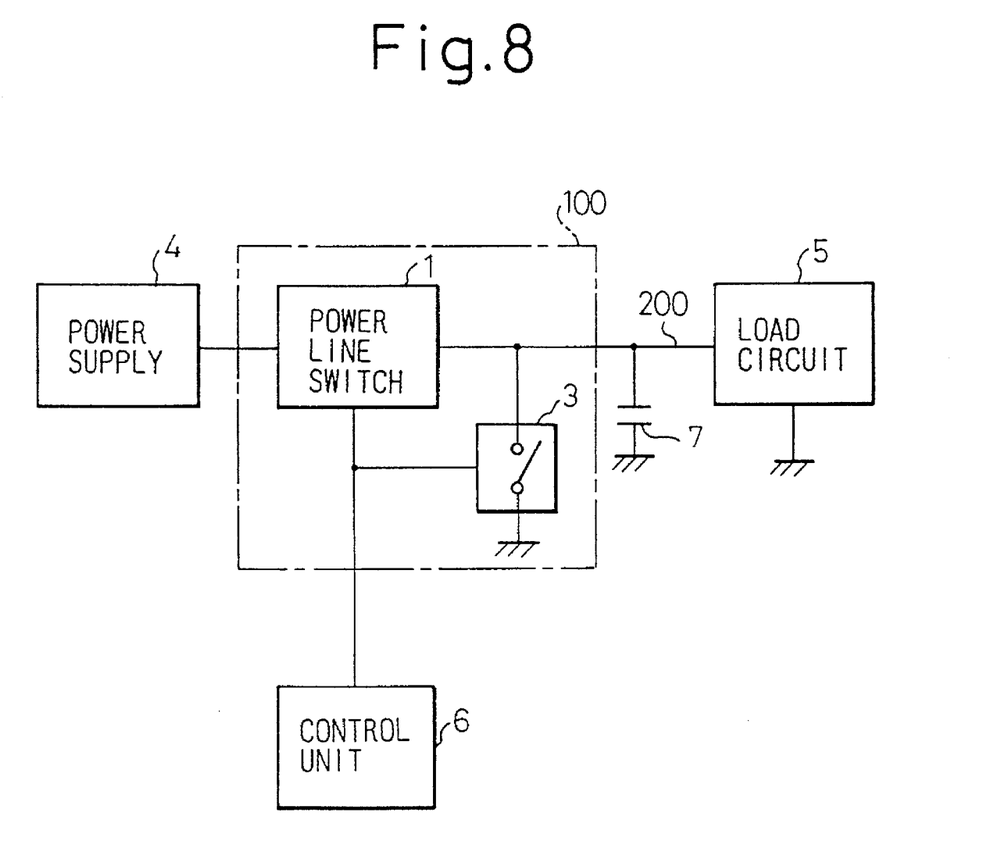
FIG. 8 is a diagram illustrating a fundamental constitution of a second aspect of the present invention.

FIG. 8 is a diagram illustrating a fundamental constitution of a second aspect of the present invention.

In FIG. 8, reference numeral 1 denotes a power line switch; 4 denotes a power supply; 5 denotes a load circuit; 6 denotes a control unit; 7 denotes a capacitive element; 200 denotes a power supply line; and 3 denotes a discharge circuit.

In the circuit shown in FIG. 8, when the power line switch 1 is turned off, the electric charge stored in a capacitive element 7 which stabilizes the voltage of the power supply line 200 is quickly discharged through the discharge circuit 3. When the power supply line switch 1 is turned on, the discharge circuit 3 is cut off, therefore, undesirable current does not flow through the discharge circuit 3. Accordingly, the consumption of electric power can be reduced.

Figure 9:
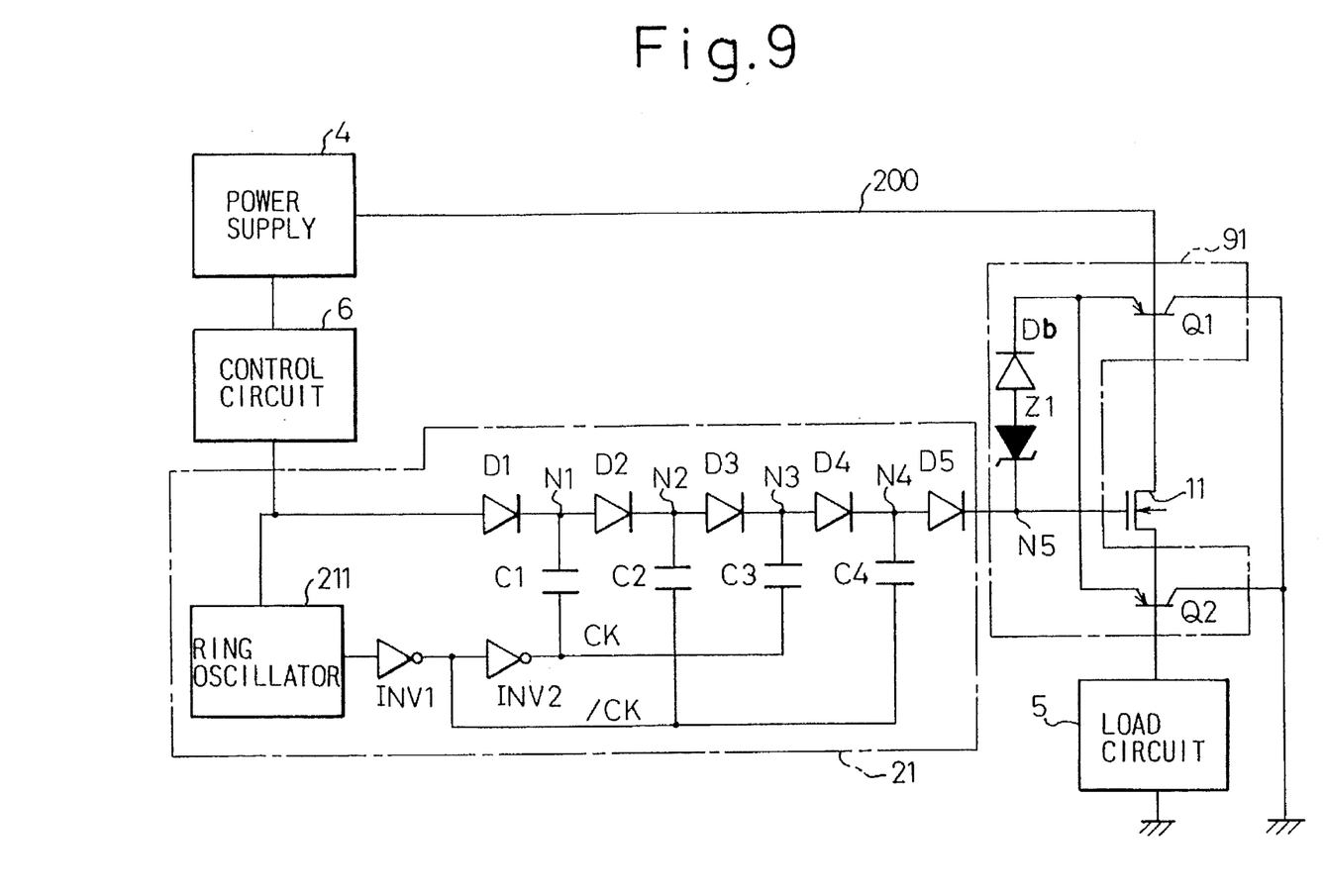
FIG. 9 is a diagram illustrating a constitution of a first embodiment of the present invention.

FIG. 9 is a diagram illustrating the constitution of the first embodiment of the present invention.

In FIG. 9, reference numeral 11 denotes an N-channel MOS transistor; 4 denotes a power supply; 5 denotes a load circuit; 6 denotes a control unit; 21 denotes a charge pump circuit which boosts a control signal; 91 denotes a clamp circuit; and 200 denotes a power supply line. The charge pump circuit 21 corresponds to the voltage conversion means 2, and the clamp circuit 91 corresponds to the clamp means 9.

As shown in FIG. 9, the charge pump circuit 21 includes a ring oscillator 211; five diodes D1, D2, D3, D4, D5; four capacitive elements C1, C2, C3, C4; and two inverters INV1, INV2. The clamp circuit 91 includes a Zener diode Z1; a diode Db; and two PNP transistors Q2.

When the N-channel MOS transistor 11 is turned on, the control circuit 6 outputs a control signal which has a voltage similar to the output voltage (SV) of the power supply 4. This control signal is applied to an anode of the diode D1 and to the ring oscillator 211. Then, the ring oscillator 211 starts to oscillate and outputs pulses. The pulses are input to the inverter INV1, and the output of the inverter INV1 is further input to the inverter INV2. In this way, complimentary pulses CK and/CK are generated. When CK is at low level, a voltage of a node N1 becomes about 5V, and the capacitive element C1 is charged to this voltage. Next, when CK changes to high level, the voltage of the node N1 also increases because a voltage of one electrode of the capacitive element C1 increases. Because the diode D1 exists between the node N1 and the control circuit 6, a potential of the node N1 becomes higher than that of the control signal. When the potential of the node N1 becomes high, a node N2 is charged by the potential of N1 through the diode D2, and a potential of N2 becomes a level similar to that of N1. At this time, /CK which is applied to one electrode of C2 is at low level. When CK changes to low level and /CK changes to high level, the potential of N2 further increases, and a potential of a node N3 also becomes a level similar to that of N2. When these operations are repeated, a potential of a node N5 becomes high, namely, a voltage of the signal output from a cathode of the diode D5 is boosted.

The node N5 is connected to the power supply line 200 via the Zener diode Z1, the diode Db, and the transistor Q1 or Q2. Therefore, even though the potential of the node N5 is boosted by the charge pump circuit 21, it does not become higher than a sum of a potential of the power supply line 200, a threshold value VFZ1 of the Zener diode Z1, a threshold value VFDb of the diode Db, and a threshold value VBEPNP of the transistor Q1 or Q2. Namely, the voltage of the node N5 is higher than that of the power supply line 200 by VFZ1+VFDb+VBEPNP. This voltage is applied to a gate of the N-channel MOS transistor 11.

Because the ON resistance of the MOS transistor is constant when the voltage difference between the gate and the power supply line is constant, the ON resistance of the MOS transistor of FIG. 9 is constant even when the voltage of the power supply line changes.

The N-channel MOS transistor 11 turns off when the control signal output from the control circuit 6 is at low level. Generally, the OFF resistance of the N-channel MOS transistor is sufficiently high.

When the power line connection circuit is integrated into an IC, the N-channel MOS transistor 11, the charge pump circuit 21 and the clamp circuit 91 are preferably integrated into the IC chip. However, either of the charge pump circuit 21 or the clamp circuit 91 may be integrated with the N-channel MOS transistor 11 into the IC.

Although the N-channel MOS transistor is used in the first embodiment, a P-channel MOS transistor can be used as a switch. When the P-channel MOS transistor is used, as described with reference to FIG. 1B, a control signal of low level, namely 0V signal is applied to the gate of the transistor in order to connect the load circuit to the power supply line, and a voltage higher than a power supply voltage by a predetermined value is applied to the gate in order to cut off the load circuit from the power supply line. By applying the higher voltage, the OFF resistance is made sufficiently large.

When the P-channel MOS transistor is used, the ON resistance becomes high but the size of the switch transistor is large. However, the circuit constitution can be simplified.

Figure 10:
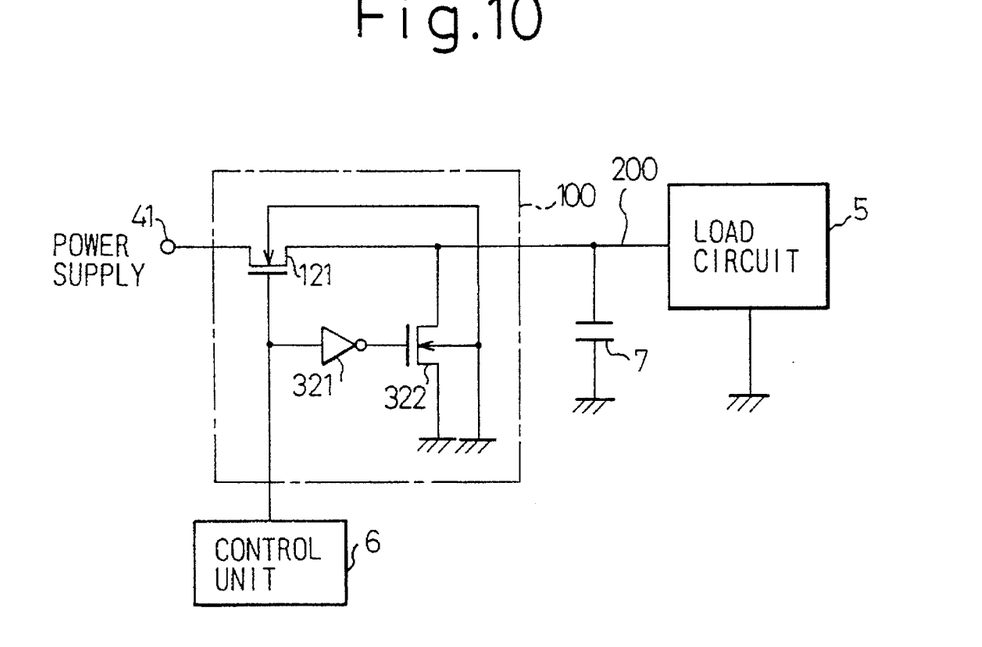
FIG. 10 is a diagram illustrating a constitution of a second embodiment of the present invention.

FIG. 10 is a diagram illustrating the constitution of the second embodiment of the present invention.

In FIG. 10, reference numeral 121 denotes an N-channel MOS transistor which corresponds to the power line switch; 321 denotes an inverter; 322 denotes an N-channel MOS transistor which connects the power supply line 200 to a ground line; and 7 denotes a capacitor for stabilizing the voltage of the power supply line 200, which is connected between the power supply line 200 and the ground line. The two N-channel MOS transistors 121, 322 and the inverter B21 are formed inside the switch IC for power supply lines.

The control signal from the control unit 6 is applied to the gate of the N-channel MOS transistor 121 as well as to the gate of the N-channel MOS transistor 322 via the inverter B21. When the N-channel MOS transistor 121 is turned on, therefore, the N-channel MOS transistor 322 is turned off and, conversely, when the N-channel MOS transistor 121 is turned off, the N-channel MOS transistor B22 is turned on. It is possible to sufficiently increase the OFF resistance of the N-channel MOS transistor B22, so that a very small current flows from the power supply line 200 to ground even when the power supply voltage is applied to the power supply line 200. When the application of the power supply voltage to the power supply line 200 is stopped, the electric charge of the capacitor 7 quickly flows to earth via the N-channel MOS transistor 322 reducing the probability of causing erroneous operation in the device unit 5.

Figure 11:
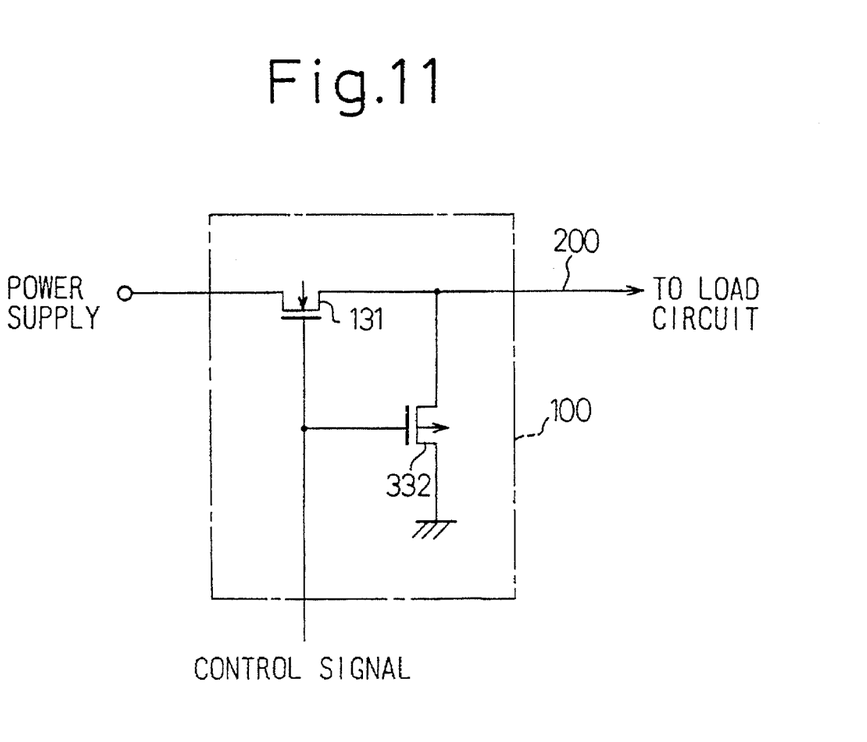
FIG. 11 is a diagram illustrating a constitution of a third embodiment of the present invention.

FIG. 11 is a diagram illustrating the constitution according to a third embodiment, wherein a P-channel MOS transistor 332 is provided instead of the N-channel MOS transistor 322 of the second embodiment of FIG. 10, obviating the need of using the inverter.

Figure 12:
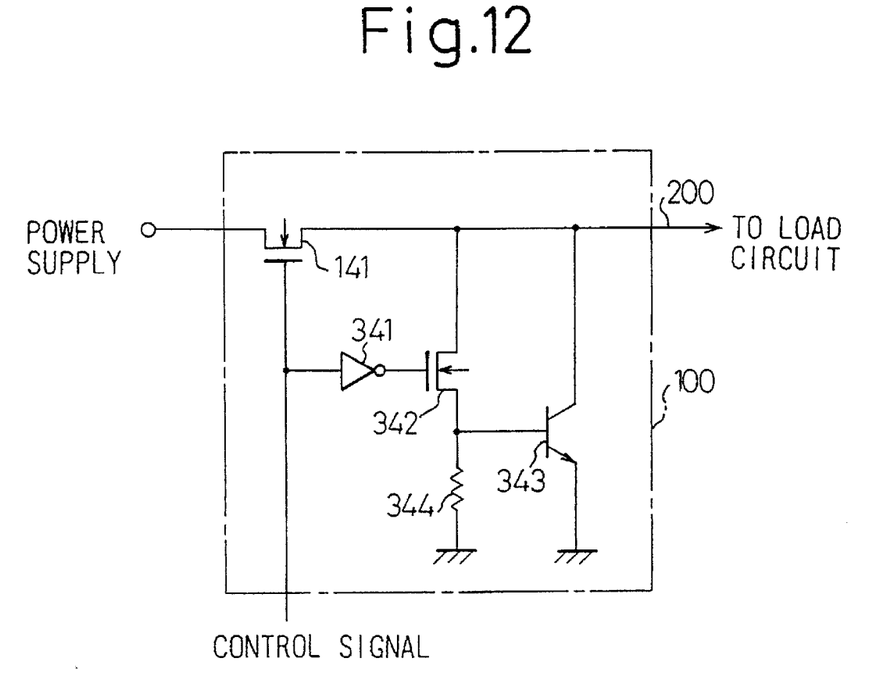
FIG. 12 is a diagram illustrating a constitution of a fourth embodiment of the present invention.

FIG. 12 is a diagram illustrating the constitution according to a fourth embodiment, wherein a resistor 322 and an NPN transistor 343 are added to the second embodiment of FIG. 10. With this constitution, the NPN transistor 323 is turned on or off as the N-channel MOS transistor 322 is turned on or off. Besides, as the NPN transistor 323 is turned on, the current flows to ground more quickly than when the electric charge stored in the capacitor is discharged through the N-channel MOS transistor 322 of FIG. 2 only.

Figure 13:
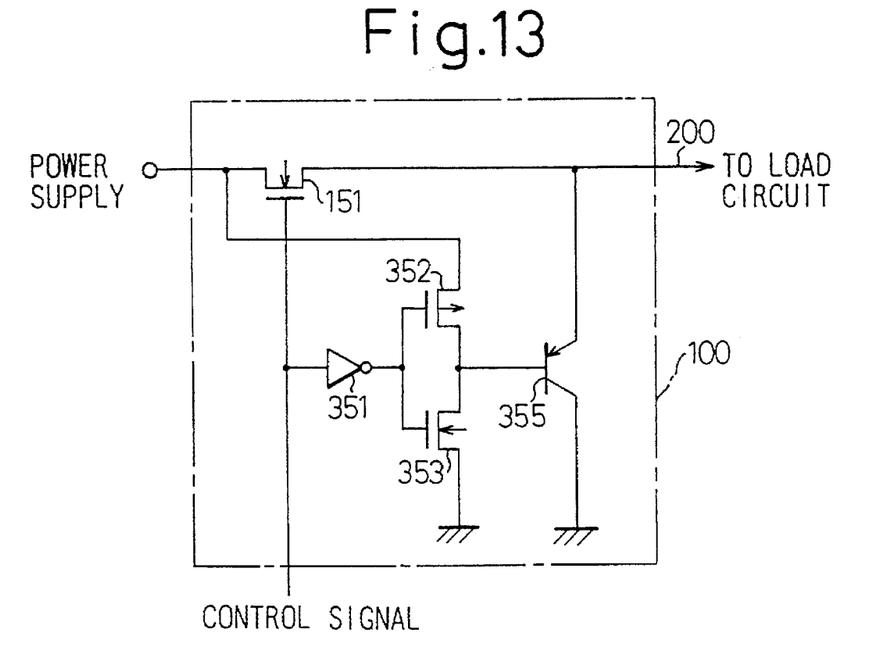
FIG. 13 is a diagram illustrating a constitution of a fifth embodiment of the present invention.

FIG. 13 is a diagram illustrating the constitution according to a fifth embodiment, wherein a PNP transistor 355 is used as a transistor for discharging. The base of the PNP transistor 355 receives an output of a CMOS inverter circuit which is constituted by a P-channel MOS transistor 352 and an N-channel MOS transistor 353. In this case, however, the circuit is not able to lower the potential of the power supply line 200 down to ground potential (GND). Therefore, this embodiment should be used for such applications that do not develop trouble even under such a condition.

Figure 14:
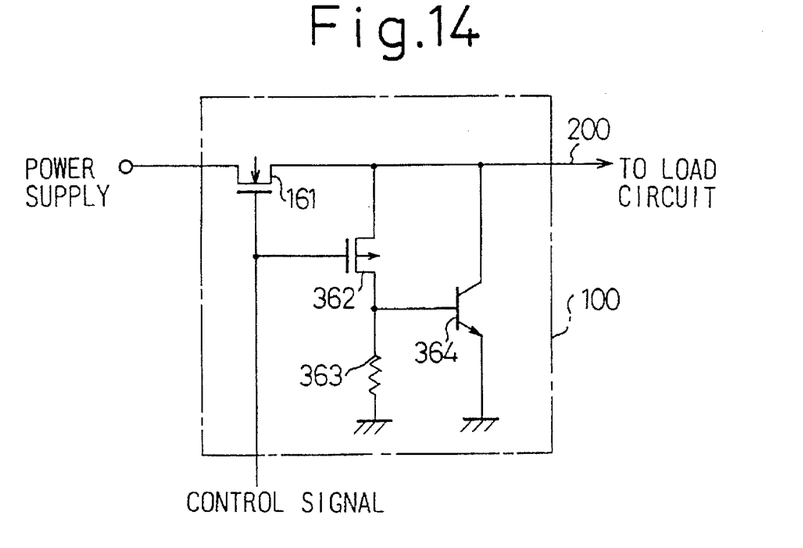

FIG. 14 is a diagram illustrating the constitution according to a sixth embodiment, wherein a resistor 364 and an NPN transistor 364 are added to the third embodiment of FIG. 11. Similarly, therefore, the electric charge is quickly discharged through the NPN transistor 364.

Figure 15:
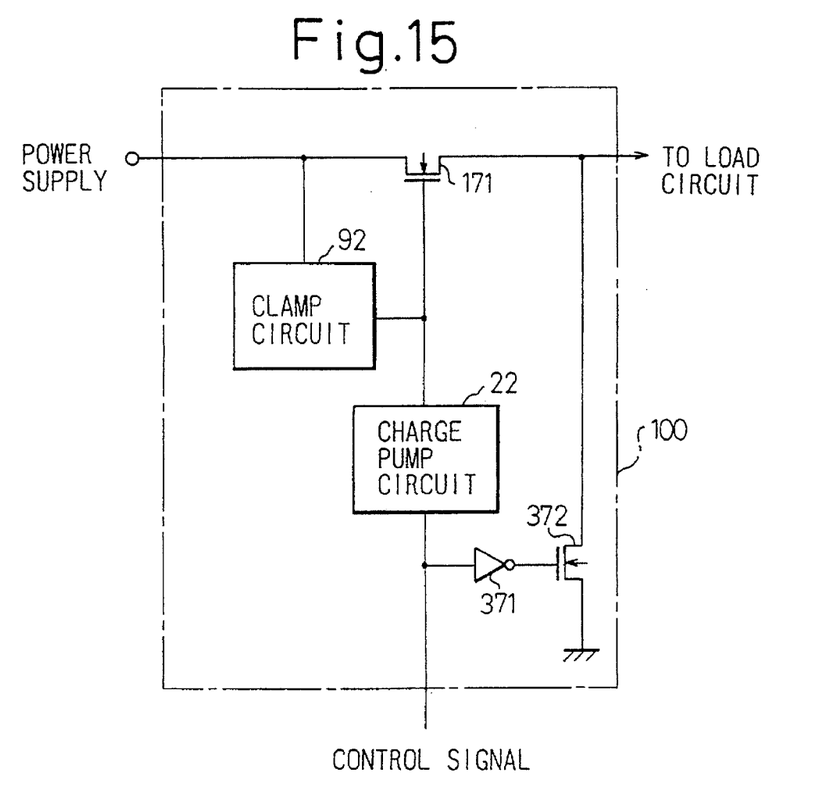
FIG. 15 is a diagram illustrating a constitution of a seventh embodiment of the present invention.

FIG. 15 is a diagram illustrating the constitution according to a seventh embodiment, wherein the N-channel MOS transistor of the discharge circuit of the second embodiment of FIG. 10 is added to the constitution of the first embodiment that has the charge pump circuit and the clamp circuit of FIG. 9. This constitution makes it possible to obtain both of the effects explained in the foregoing.

As described above, according to the present invention, there is provided a switching IC for power supply lines for obtaining a desired ON resistance and a desired OFF resistance without requiring complex external circuit and a power line switch IC which quickly discharges the electric charge in the capacitive element for stabilizing the voltage of the power supply line when it is changed over to the off state and does not permit current to flow wastefully when it is in the on state.

We claim:

1. A power line connection circuit for controlling a connection of a power supply line to a load circuit, comprising:

a MOS transistor connecting said power supply line to said load circuit, the conductance of said MOS transistor being changeable by applying a signal to a gate of said MOS transistor;

voltage conversion means for converting a voltage of said power supply line and applying the converted voltage to said gate of said MOS transistor; and clamp means for limiting, and simultaneously, for allowing said converted voltage output from said voltage conversion means to be less than or equal to a sum of a predetermined voltage plus the voltage of said power supply line;

wherein said voltage conversion means is a charge-pump circuit and said clamp means includes a constant voltage drop circuit, connected to said charge pump and said gate of said MOS transistor at a first end;

a first transistor, connected to a second end of said constant voltage drop circuit and ground, conductance of said first transistor controlled by a connection to the power supply; and a second transistor connected to said second end of said constant voltage drop circuit and ground, conductance of said second transistor controlled by a connection to said MOS transistor.

2. The power line connection circuit of claim 1, wherein said voltage drop circuit includes one or more diodes connected in series.

3. The power line connection circuit of claim 2, wherein said first and second transistors are bipolar junction transistors, each having a collector connected to ground, each having an emitter connected to said second end of said constant voltage drop circuit, said first transistor having a base connected to the power supply line and said second transistor having a base connected to said MOS transistor.

4. A switch IC for controlling a connection of a power supply line to a load circuit, comprising:

a MOS transistor connecting said power supply line to said load circuit, the conductance of said MOS transistor being changed by applying a signal to a gate of said MOS transistor;

voltage conversion means for convening a voltage of said power supply line and applying said converted voltage to said gate of said MOS transistor; and clamp means for limiting, and simultaneously, for allowing said convened voltage output from said voltage conversion means to be less than or equal to a sum of a predetermined voltage plus the voltage of said power supply line;

wherein said voltage conversion means is a charge-pump circuit and said clamp means includes a constant voltage drop circuit, connected to said charge pump and said gate of said MOS transistor at a first end;

a first transistor, connected to a second end of said constant voltage drop circuit and ground, conductance of said first transistor controlled by a connection to the power supply; and a second transistor connected to said second end of said constant voltage drop circuit and ground, conductance of said second transistor controlled by a connection to said MOS transistor.

5. The IC switch of claim 4, wherein said voltage drop circuit includes one or more diodes connected in series.

6. The switch IC of claim 5, wherein said first and second transistors are bipolar junction transistors, each having a collector connected to ground, each having an emitter connected to said second end of said constant voltage drop circuit, said first transistor having a base connected to the power supply line and said second transistor having a base connected to said MOS transistor.

* * * * *

UNITED STATES PATENT AND TRADEMARK OFFICE
CERTIFICATE OF CORRECTION

PATENT NO.: 5,650,741
DATED : July 22, 1997
INVENTOR(S): NAKAMURA et al.

It is certified that error appears in the above-identified patent and that said Letters Patent is hereby corrected as shown below:

On the title page item [73], assignee, is in error. Please delete the second assignee, "Kyushu Fumitsu Electronics Limited" and insert --Kyushu Fujitsu Electronics Limited-- therefor.

Signed and Sealed this

Twenty-seventh Day of January, 1998

*Attest:*

BRUCE LEHMAN

*Attesting Officer*     *Commissioner of Patents and Trademarks*